United States Patent
Duesman et al.

(10) Patent No.: US 7,215,361 B2
(45) Date of Patent: May 8, 2007

(54) METHOD FOR AUTOMATED TESTING OF THE MODULATION TRANSFER FUNCTION IN IMAGE SENSORS

(75) Inventors: Kevin Duesman, Boise, ID (US);
Jeffrey Bruce, Meridian, ID (US);
Peter P. Altice, Jr., Meridian, ID (US);
Moshe Reuven, Boise, ID (US);
Donald E. Robinson, Blise, CA (US);
Ed Jenkins, Meridian, ID (US); Joey Shah, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 555 days.

(21) Appl. No.: 10/663,709

(22) Filed: Sep. 17, 2003

(65) Prior Publication Data

US 2005/0057655 A1   Mar. 17, 2005

(51) Int. Cl.
*H04N 17/00* (2006.01)
*H04N 17/02* (2006.01)

(52) U.S. Cl. .................................. 348/187; 348/241

(58) Field of Classification Search ................ 348/187, 348/188, 175, 178, 241, 248, 249, 250; 356/124.5
See application file for complete search history.

(56) References Cited

U.S. PATENT DOCUMENTS

| 5,471,515 | A |   | 11/1995 | Fossum et al. |
| 5,621,519 | A | * | 4/1997  | Frost et al. ............... 356/124.5 |
| 5,651,076 | A | * | 7/1997  | Blanc et al. ................ 382/141 |
| 5,708,263 | A |   | 1/1998  | Wong |
| 5,818,572 | A | * | 10/1998 | Pappas et al. ........... 356/124.5 |
| 6,900,884 | B2 | * | 5/2005  | Alderson et al. ........ 356/124.5 |

* cited by examiner

*Primary Examiner*—Michael H. Lee
(74) *Attorney, Agent, or Firm*—Dickstein Shapiro LLP

(57) ABSTRACT

A method for automatically measuring the modulation transfer function of an imager is disclosed. A opaque mask is placed over selected columns and rows of the imager during fabrication. In the course of an automated process, photons are uniformly shone over the image sensor. The amount of the input signal that flows from the unmasked pixel cells to the masked pixel cells can then be measured and the modulation transfer function can be determined.

60 Claims, 6 Drawing Sheets

METHOD FOR AUTOMATED TESTING OF THE MODULATION TRANSFER FUNCTION IN IMAGE SENSORS

FIELD OF THE INVENTION

The present invention is directed to the measurement of the modulation transfer function of an imager, for example a CCD, CMOS or other imager.

BACKGROUND OF THE INVENTION

There are a number of different types of semiconductor-based imagers, including charge coupled devices (CCDs), photodiode arrays, charge injection devices and hybrid focal plane arrays, among others. CCDs are often employed for image acquisition and enjoy a number of advantages, which makes it the incumbent technology, particularly for small size imaging applications. CCDs are also capable of large formats with small pixel size and they employ low noise charge domain processing techniques. However, CCD imagers also suffer from a number of disadvantages. For example, they are susceptible to radiation damage, they exhibit destructive read out over time, they require good light shielding to avoid image smear and they have high power dissipation for large arrays. Additionally, while offering high performance, CCD arrays are difficult to integrate with CMOS processing in part due to a different processing technology and to their high capacitances, complicating the integration of on-chip drive and signal processing electronics with the CCD array. While there have been some attempts to integrate on-chip signal processing with the CCD array, these attempts have not been entirely successful. CCDs also must transfer an image by line charge transfers from pixel to pixel, requiring that the entire array be read out into a memory before individual pixels or groups of pixels can be accessed and processed. This takes time. CCDs may also suffer from incomplete charge transfer from pixel to pixel during charge transfer, which also results in image smear.

Because of the inherent limitations in CCD technology, there is an interest in CMOS imagers for possible use as low cost imaging devices. A fully compatible CMOS sensor technology enabling a higher level of integration of an image array with associated processing circuits would be beneficial to many digital imaging applications.

The advantages of CMOS imagers over CCD imagers are that CMOS imagers have a low voltage operation and low power consumption; CMOS imagers are compatible with integrated on-chip electronics (control logic and timing, image processing, and signal conditioning such as A/D conversion); CMOS imagers allow random access to the image data; and CMOS imagers have lower fabrication costs as compared with the conventional CCD since standard CMOS processing techniques can be used. Additionally, low power consumption is achieved for CMOS imagers because only one row of pixels at a time needs to be active during the readout and there is no charge transfer (and associated switching) from pixel to pixel during image acquisition. On-chip integration of electronics is particularly advantageous because of the potential to perform many signal conditioning functions in the digital domain (versus analog signal processing) as well as to achieve a reduction in system size and cost.

A CMOS imager circuit, for example, includes a focal plane array of pixel cells; each cell includes a photosensor, for example, a photogate, photoconductor or a photodiode overlying a substrate for producing a photo-generated charge in a doped region of the substrate. A typical readout circuit in each pixel cell includes at least a source follower transistor and a row select transistor for coupling the source follower transistor to a column output line; however other readout circuit configurations are possible. The pixel cell also may have a floating diffusion node, connected to the gate of the source follower transistor. Charge generated by the photosensor is sent to the floating diffusion node. The imager may also include a transistor for transferring charge from the photosensor to the floating diffusion node for charge conversion to a voltage and another transistor for resetting the floating diffusion node to a predetermined charge level prior to charge transference.

In a CMOS imager pixel cell, for example, a four transistor (4T) pixel, all the active elements of a pixel cell perform the necessary functions of (1) photon to charge conversion; (2) transfer of charge to the floating diffusion node; (3) resetting the floating diffusion node to a known state before the transfer of charge to it; (4) selection of a pixel cell for readout; and (5) output and amplification of a signal representing a reset voltage and a pixel signal voltage based on the photo converted charges. The so-called three transistor (3T) pixel circuit operates similarly, but connects the photosensor directly to the source follower.

CMOS imagers are generally known and are discussed, for example, in Nixon et al., "256×256 CMOS Active Pixel Sensor Camera-on-a-Chip," IEEE Journal of Solid-State Circuits, Vol. 31(12) pp. 2046–2050, 1996; Mendis et al, "CMOS Active Pixel Image Sensors," IEEE Transactions on Electron Devices, Vol. 41(3) pp. 452–453, 1994 as well as U.S. Pat. No. 5,708,263 and U.S. Pat. No. 5,471,515, all of which are herein incorporated by reference.

FIG. 1 illustrates a block diagram of a conventional CMOS imager device 308 having an array 200 of pixel cells, which may be 3T, 4T or pixels using other numbers of transistors. Pixel cell array 200 comprises a plurality of pixel cells arranged in a predetermined number of columns and rows. The pixel cells of each row in array 200 are all turned on at the same time by a row select line, and the pixel cells of each column are selectively output by respective column select lines. The row lines are selectively activated by the row driver 210 in response to row address decoder 220 and the column select lines are selectively activated by the column driver 260 in response to column address decoder 270. The CMOS imager is operated by the control circuit 250 that controls address decoders 220, 270 for selecting the appropriate row and column lines for pixel operation and readout, and row and column driver circuitry 210, 260 that apply driving voltage to the drive transistors of the selected row and column lines. The pixel column signals, which typically each include a pixel reset signal, $V_{rst}$ and a pixel image signal, $V_{sig}$, for a pixel cell selectively connected to a column line are read by a sample and hold circuit 261 associated with the column driver 260 and are subtracted by amplifier 262 to form a differential signal $V_{rst}-V_{sig}$ for each pixel cell which is amplified and then digitized by analog to digital converter 275. The analog to digital converter 275 converts the received analog pixel signals to digital signals, which are fed to an image processor 280 to form a digital image.

The operation of the charge collection of the CMOS imager is known in the art and is described in several publications such as Mendis et al., "Progress in CMOS Active Pixel Image Sensors," SPIE Vol. 2172, pp. 19–29 1994; Mendis et al., "CMOS Active Pixel Image Sensors for Highly Integrated Imaging Systems," IEEE Journal of Solid State Circuits, Vol. 32(2), 1997; and Eric R, Fossum, "CMOS Image Sensors: Electronic Camera on a Chip," IEDM Vol. 95 pages 17–25 (1995) as well as other publications. These references are incorporated herein by reference.

Imager arrays are typically tested to determine the signal to noise ratio for each pixel cell or a row or column of pixel cells. In addition, when pixel cells receive an input signal, some of the input signal is also received by adjacent pixel cells. The spread of an input signal to adjacent pixel cells causes the adjacent pixel cells to incorrectly sense light intensity from a received image. Accordingly, the amount of such adjacent pixel cell spread is an important parameter to consider in the design and fabrication of a pixel cell array. The amount of spread of an input signal to adjacent pixel cells, carrier diffusion (electrical crosstalk), can be determined by the modulation transfer function (MTF) of the imager array, which is an effective measurement of the sharpness and spatial resolution for the imager array. The greater the carrier diffusion, the lower the sharpness and resolution for the imager array. The MTF for an imager array can also be calculated using measurements of input signal reflection, interference or scattering as the input signal passes through various layers, i.e. metal, microlens, etc., of the imager array (optical crosstalk). This MTF is a value of interest for imager arrays in general, including both CCD and CMOS arrays, among others.

A current method for testing MTF for image sensor arrays involves measuring the edge response of the imager array by applying an image signal to the image array that has a dark image section adjacent to a light image section. The edge between the dark and light sections is lined up exactly between two adjacent pixel columns in the imager array and the MTF is calculated as follows:

$$MTF=(A-B)/(C-D)$$

where A=the pixel value on the light side of the edge;
B=the pixel value on the dark side of the edge;
C=the pixel value on the light side away from the edge; and
D=the pixel value on the dark side away from the edge.

This formula compares the degraded contrast at the light/dark edge to the maximum contrast of the sensor (totally dark signal–totally bright or saturated signal). The test typically uses an entire column of pixel cells, which are averaged, instead of an individual pixel cell in order to avoid erroneous aberrations of individual pixel cells.

It is difficult to automate the above-described testing method for several reasons. Such testing is generally performed during probe, where various tests are automatically performed to determine acceptable and failing parts. During probe the alignment of the dark and light edge of an input image exactly between two adjacent columns of pixel cells of an imager array is complex since, for example, rotation of the die and input image have to be the same. Accordingly, there is a need and desire for a better method of measuring the MTF of pixel array imagers.

BRIEF SUMMARY OF THE INVENTION

The present invention provides an automated method for measuring the MTF of a pixel cell array, for example, a pixel cell array of a CMOS imager. A mask consisting of an opaque material, for example, a metal is placed over selected columns and rows of the imager array during fabrication. During an automated process such as a probe process, which tests the imager array at the wafer level for failing components, or final testing where packaged parts are tested, light is uniformly shone over the pixel cells on either side of the mask edge. The amount of pixel signal that flows from the unmasked pixel cells to the pixel cells that are masked can then be measured and the MTF can be determined. The mask can be fabricated as a mask that is used to separate the pixel cells of an array used for image acquisition from those used as merely dark pixels (not used for image acquisition), or can be fabricated as an opening in such a mask that is provided in a dark pixel area.

BRIEF DESCRIPTION OF THE DRAWINGS

The foregoing and other features and advantages of the invention will become more apparent from the detailed description of the exemplary embodiments of the invention given below in connection with the accompanying drawings.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those of ordinary skill in the art to make and use the invention, and it is to be understood that structural, logical or procedural changes may be made to the specific embodiments disclosed without departing from the spirit and scope of the present invention.

The present invention provides an automated method for measuring the modulation transfer function (MTF) in digital imagers by measuring the amount of light received by masked and unmasked pixel cells of an imager array and calculating the MTF (crosstalk) of the imager. Although the invention has applicability to any type of digital imager, including but not limited to CCD and CMOS imagers, the principles of the invention will be described below in connection with a CMOS imager.

Figure 1:
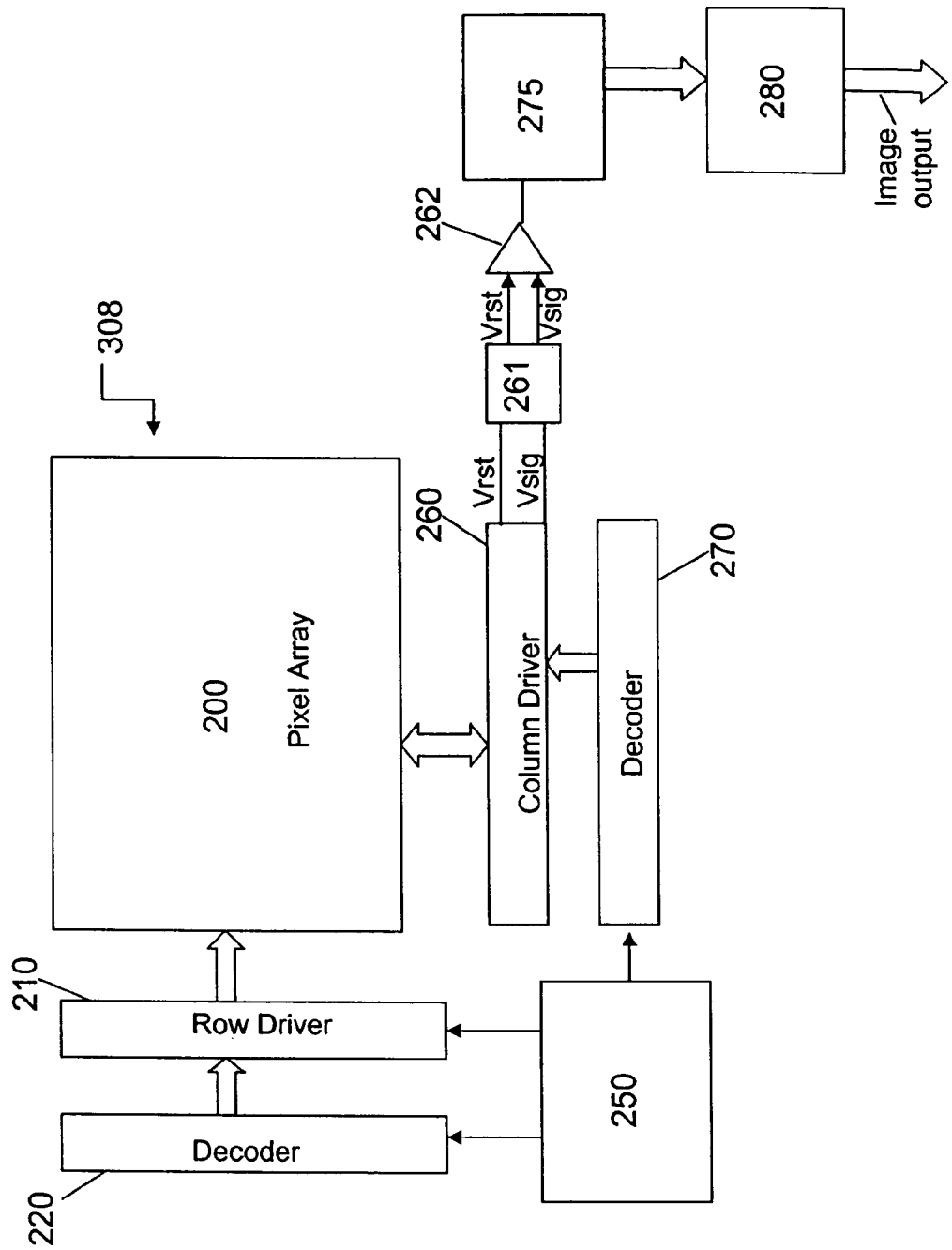
FIG. 1 is a block diagram of a conventional CMOS imager.
Figure 2:
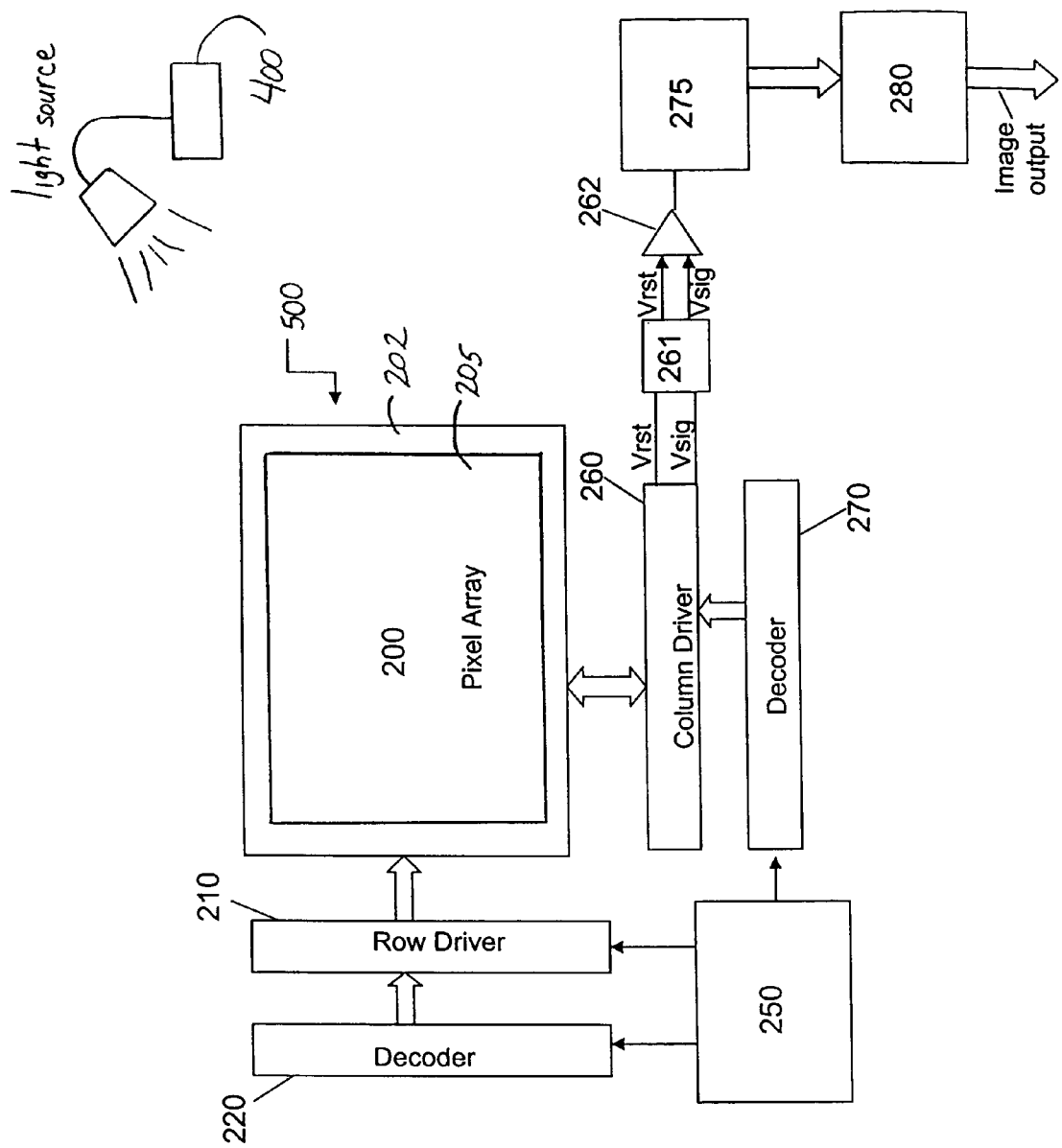
FIG. 2 is a block diagram of a CMOS pixel sensor under test according to a first exemplary embodiment of the invention.

FIG. 2 depicts a block diagram of a CMOS pixel sensor test system 500 in accordance with a first exemplary embodiment of the invention. An opaque mask 202, for example, a metal mask, is formed on an edge of pixel cell array 200 and masks a predetermined number (e.g., 12) of rows of pixel cells at the top and bottom edges of the pixel cell array 200. Opaque mask 202 is permanently formed on the pixel array 200. In addition, the mask masks a predetermined number (e.g., 16) of columns of pixel cells at the left side and right side edges of the pixel cell array 200. Mask 202 is formed on the pixel cell array during fabrication of the CMOS imager. The mask 202 may be formed on the pixel cell array 200 using photolithography and dry/wet etching, or any other method. In addition, a color filter 205 is depicted as covering the pixel cells of pixel cell array 200 enclosed within the opaque mask 202. The use of color filters may be desirable when testing with different colors (e.g., wavelengths) of light, but are not required to practice the invention.

Once the mask 202 is formed on the pixel cell array 200 during fabrication, light from light source 400, which is less than the saturation light intensity, is uniformly shone over the entire pixel cell array 200 during post fabrication probe testing. The test light should be below the intensity that would cause pixel saturation since pixel saturation may cause excessive electrons on the light side to bloom into the dark side, which would distort the MTF measurement.

The response is measured by reading out and measuring pixel signals on either side of a mask edge. Measurements are taken of the pixel signals on both sides of the border between the masked and unmasked portion of pixel cell array 200. Measurements of multiple pixel signals on both sides of the border may also be utilized to avoid an erroneous result due to an aberration of an individual pixel cell and provide statistical significance to the measurement. When measuring multiple pixel cells on a particular side of the border, the signals of the multiple pixel cells on the same side of the border are averaged. In this border region, rather than a sharp black to white transition, a gray region is expected due to the effects of MTF. The crosstalk can be measured at the border region and used to determine the MTF of the CMOS imager by techniques known in the art. It should be noted that this measurement is not limited to using pixels at all four edges of the opaque mask 202, but rather may be performed on any part of the border between the pixel cells covered by the opaque mask 202, and the pixel cells not covered by the opaque mask 202.

Figure 2A:
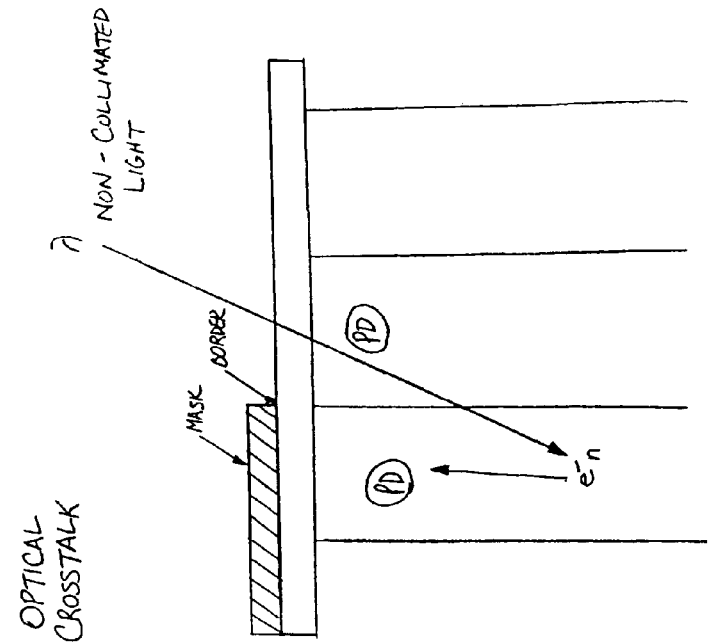
FIG. 2A is an illustration of electrical crosstalk and optical crosstalk.
Figure 2A:
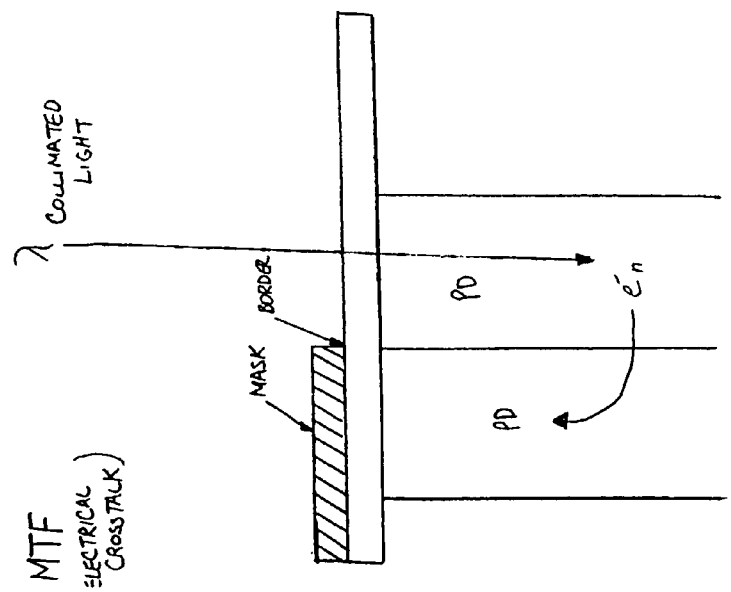

Ideally, the light used to measure MTF is collimated so that crosstalk being measured at the border between the masked and unmasked pixel cells is limited to electrical crosstalk, while minimizing optical crosstalk, illustrated in FIG. 2A. However, the light used at probe is generally not collimated light. For best results, an initial test is performed on a pixel cell array utilizing collimated light to form a standard, or control, test result. It should be noted, however, that this test standard would be useful only for a particular batch of image sensors or for multiple batches depending on the degree with which the MTF changes between batches. The pixel cell array is then tested during probe, or some other automated process, using light that is not collimated.

The test results between the test using non-collimated light and the standard are then compared. If the difference between the two tests is negligible, the measurement of MTF utilizing non-collimated light is deemed reliable. However, if the difference between the two tests is not negligible, a correlation table or scaling factor may be employed to match the MTF calculated using non-collimated light to the standard test result using collimated light. Acceptable deviations can be established by the operator depending on the specific application, test conditions, etc. Once the MTF is measured, correction of the test using non-collimated light may then be performed. As is known in the art, the correction algorithm involves performing an inverse MTF transform on the image.

Figure 3:
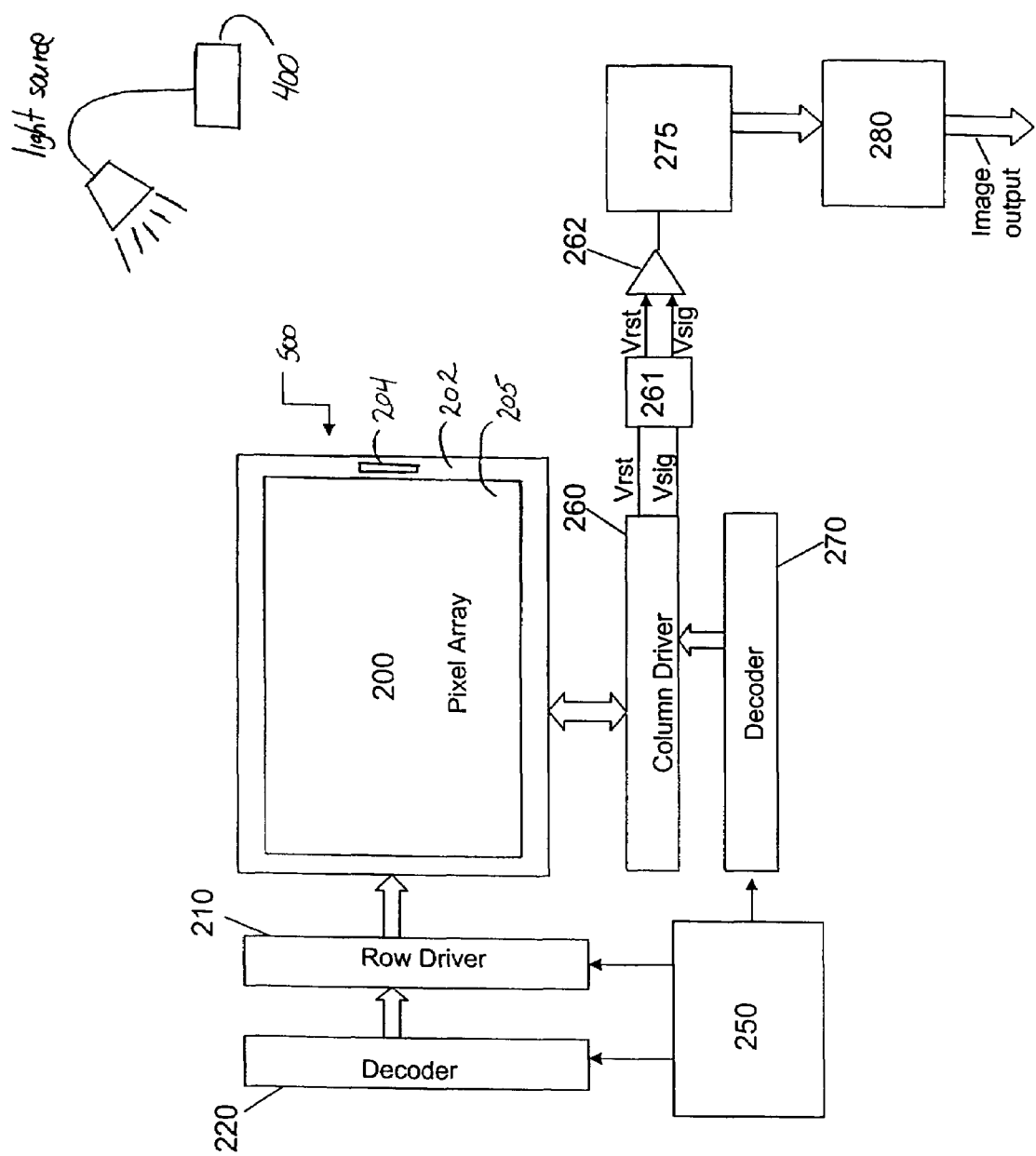
FIG. 3 is a block diagram of a CMOS pixel sensor under test according to a second exemplary embodiment of the invention.

FIG. 3 illustrates a block diagram of a CMOS pixel sensor test system 500 in accordance with a second exemplary embodiment of the invention. This embodiment is similar to the previous embodiment; however, a permanent opening 204 is created in mask 202. For example, a window comprising 8 rows by 2 columns is provided in the mask 202, exposing pixel cells generally not used in pixel cell array 200 since these pixel cells are normally covered by the opaque mask 202.

Light is uniformly shone over the entire pixel cell array 200 during probe by light source 400, as described above. A measurement of the pixel cells on both sides of the border between the masked pixel cells and the pixel cells within the 8×2 unmasked portion 204 of the pixel cell array 200 is then taken to determine the MTF.

It should be noted that in those instances in which a color filter 205 is used, since the color filter covers only pixel cell array 200, the test performed in the, e.g., 8×2 section of the unmasked portion, as illustrated in FIG. 3, would be a black and white test. The measurement of the MTF using this unmasked area would tend to be a truer representation of the pixel cell array's resolution since there would be no color filter to create distortion of the incident light.

Figure 4:
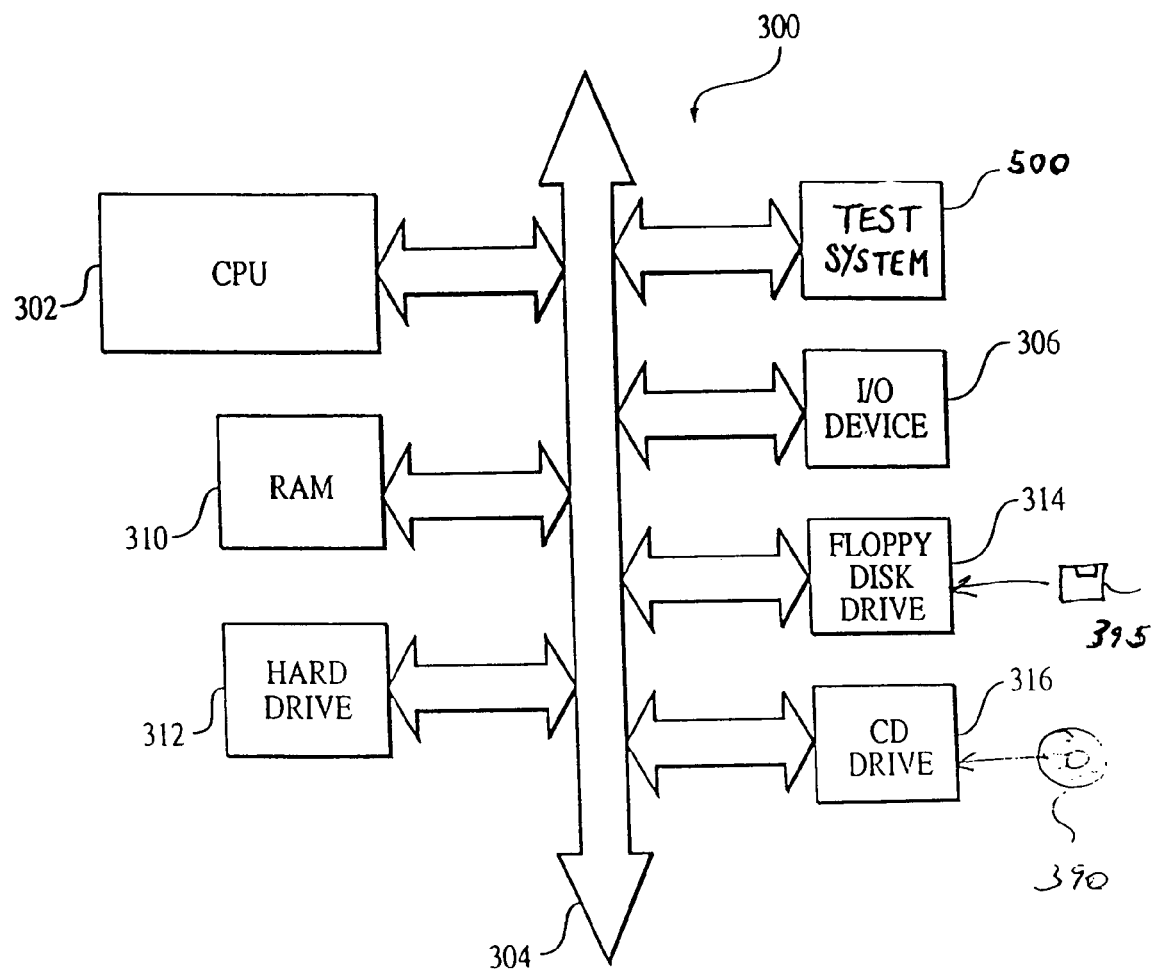
FIG. 4 is a schematic block diagram of a test system that includes software for automated testing of the modulation transfer function in a CMOS imager.

FIG. 4 depicts a processor system 300 configured to test the modulation transfer function of an imager pixel cell array under test in the FIGS. 2 and 3 test systems. System 300 includes central processing unit (CPU) 302 that communicates with various devices over bus 304. Some of the devices connected to bus 304 provide communication into and out of system 300, illustratively including input/output (I/O) device 306 and pixel sensor test system 500, as illustrated in FIGS. 2 and 3. Pixel sensor test system 500 forwards to processor system 300 measurements taken during probe, which include measurements taken for calculating MTF as described above in connection with FIGS. 2 and 3. CPU 302 then receives these measurements and calculates MTF for the pixel sensors. Other devices depicted as being connected to bus 304, including for example, random access memory (RAM) 310, hard drive 312, and one or more peripheral memory devices such as floppy disk drive 314 and compact disk (CD) drive 316. Any one of the many storage mediums capable of being read by CPU 302, including but not limited to floppy disk 395 and compact disk 390, may store the test process used during operation of the FIGS. 2 and 3 pixel sensor test systems 500. The test process may be a modified version of the existing probe test software.

Figure 5:
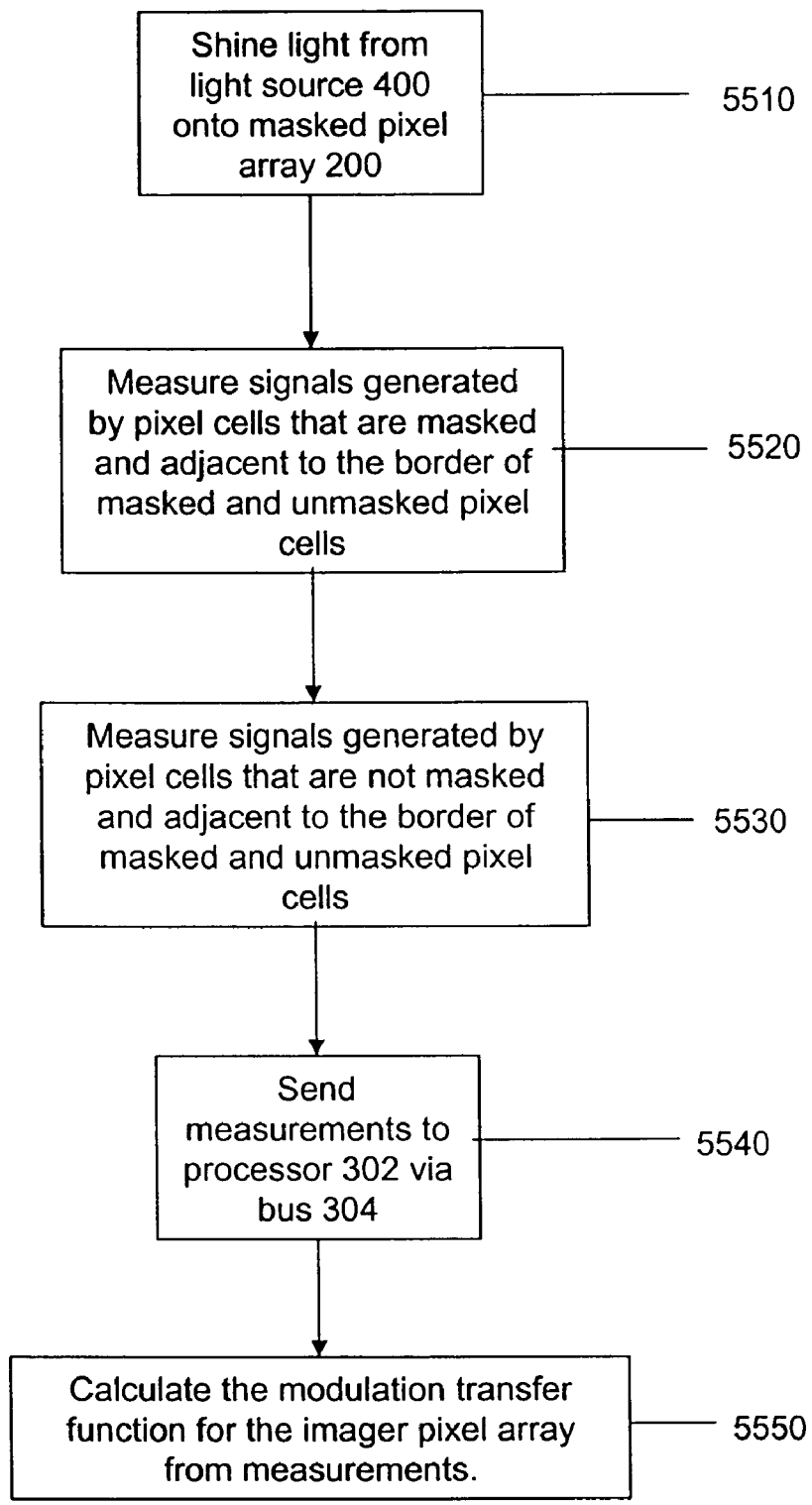
FIG. 5 is a flowchart illustrating an operational flow of FIGS. 2 and 3 block diagrams.

FIG. 5 depicts a flowchart illustrating an operational flow of an automated test process for measuring MTF on an imager array. At segment 5510, light is shone from light source 400 onto the masked pixel array 200. At segment 5520, signals generated by the masked pixel cells that are adjacent to the border between the masked and unmasked pixel cells are measured. At segment 5530, signals generated by the unmasked pixel cells that are adjacent to the border between masked and unmasked pixel cells are measured. At segment 5540, the CPU 302 calculates MTF based on the measurements taken.

While the invention has been described and illustrated with reference to specific exemplary embodiments, it should be understood that many modifications and substitutions could be made without departing from the spirit and scope of the invention. For example, although a mask 202 having specific exemplary dimensions is described in connection with the invention, it should be readily apparent that a mask of any size may be used. Further, while specific test parameters and values have been identified, practicing the invention is not limited thereto. Accordingly, the invention is not to be considered as limited by the foregoing description but is only limited by the scope of the appended claims.

What is claimed as new and desired to be protected by Letters Patent of the United States is:

1. A method of testing a modulation transfer function (MTF) of an imager comprising photosensitive cells, the method comprising:
   exposing the imager to a photon source;
   measuring an output of first and second photosensitive cells, wherein the first cell is blocked from the photon source by a layer of opaque material formed within the imager; and
   calculating the MTF using the measured outputs.

2. The method of claim 1, wherein said first and second photosensitive cells are adjacent.

3. The method of claim 1, wherein said method occurs during an automated testing process.

4. The method of claim 3, wherein said method occurs during probe testing of an imager array.

5. The method of claim 1, wherein said photon source has an intensity below photosensitive cell saturation intensity.

6. The method of claim 1, wherein said opaque material forms a mask for a plurality of photosensitive cells of an imager array.

7. The method of claim 6, wherein said masking is formed during fabrication of said imager array.

8. The method of claim 6, wherein said opaque mask covers a predetermined number of rows on at least one edge of said imager array.

9. The method of claim 6, wherein said opaque mask covers a predetermined number of columns on at least one edge of said imager array.

10. The method of claim 6, wherein said opaque mask covers a predetermined number of rows and columns on at least two edges of said imager array.

11. The method of claim 6, wherein said opaque mask covers a predetermined number of rows and columns on four edges of said imager array.

12. The method of claim 1, wherein said measuring includes the averaging of output signals from a first column and averaging the output signal from a second column of adjacent photosensitive cells.

13. The method of claim 1, wherein said opaque material is comprised of a metal.

14. The method of claim 1 further comprising aligning an edge of said opaque material between a row or column of said imager.

15. The method of claim 1, wherein said imager is a CMOS imager.

16. The method of claim 1, wherein said imager is a CCD imager.

17. A method of testing a modulation transfer function (MTF) of an imager comprising photosensitive cells, the method comprising:
   exposing a first imager to a collimated photon source;
   measuring an output of first and second adjacent photosensitive cells, wherein the first cell is blocked from the photon source by a layer of opaque material;
   calculating the MTF using the measured output to form a test standard;
   exposing the first imager to a non-collimated photon source;
   measuring an output of first and second adjacent photosensitive cells, wherein the first cell is blocked from the photon source by a layer of opaque material;
   calculating the MTF using the measured output for the test using the non-collimated photon source;
   comparing results of said first standardizing test with results of said second test using a non-collimated photon source; and
   determining whether said results attained with said second test using the non-collimated photon source are within an acceptable error margin as compared with the result attained with said first standardizing test.

18. The method of claim 17 further comprising aligning an edge of said opaque material between a row or column of photosensitive cells of said imager.

19. The method of claim 17 further comprising performing said second test on a plurality of second imagers if said test using the first imager is within an acceptable error margin.

20. The method of claim 17, wherein said method occurs during an automated testing process.

21. The method of claim 20, wherein said method occurs during probe testing of an imager array.

22. The method of claim 17, wherein said opaque material is comprised of a metal.

23. The method of claim 17, wherein said collimated and non-collimated photon source has an intensity below photosensitive cell saturation intensity.

24. The method of claim 17, wherein said imager is a CMOS imager.

25. The method of claim 17, wherein said imager is a CCD imager.

26. A method of testing a modulation transfer function (MTF) of an imager comprising photosensitive cells, the method comprising:
   exposing a first and second predetermined number of photosensitive cells in at least one of a row and column of adjacent photosensitive cells of the imager to a photon source, wherein the first predetermined number of photosensitive cells are blocked from the photon source by a layer of opaque material formed within the imager;
   measuring an output of the first and second predetermined number of photosensitive cells; and
   calculating the MTF using the measured outputs.

27. The method of claim 26 further comprising aligning an edge of said opaque material between a row or column of said imager.

28. The method of claim 26, wherein said method occurs during an automated testing process.

29. The method of claim 28, wherein said method occurs during probe testing of an imager array.

30. The method of claim 26, wherein said first and second measuring comprise averaging measurements taken from said plurality of blocked photosensitive cells and averaging measurements taken from a plurality of unblocked photosensitive cells.

31. The method of claim 26, wherein said opaque material forms a mask for a plurality of photosensitive cells of an imager array.

32. The method of claim 31, wherein said opaque material is comprised of a metal.

33. The method of claim 31, wherein said forming comprises masking said at least one photosensitive cell during fabrication of said imager array.

34. The method of claim 31, wherein said opaque mask covers a predetermined number of rows and columns on at least one edge of said imager array.

35. The method of claim 26, wherein said imager is a CMOS imager.

36. The method of claim 26, wherein said imager is a CCD imager.

37. A method of testing a modulation transfer function (MTF) of an imager comprising photosensitive cells, the method comprising:
   exposing a first imager to a collimated photon source;
   measuring an output of a first row or column and a second row or column of adjacent photosensitive cells, wherein the first row or column of cells are blocked from the photon source by a layer of opaque material;
   calculating the MTF using the measured outputs to form a test standard;
   exposing the first imager to a non-collimated photon source;
   measuring an output of said first row or column and said second row or column of adjacent photosensitive cells;
   calculating the MTF using the measured outputs for the test using the non-collimated photon source;
   comparing results of said first standardizing test with results of said second test using a non-collimated photon source; and
   determining whether said results attained with said second test using the non-collimated photon source are within an acceptable error margin as compared with the result attained with said first standardizing test.

38. The method of claim 37 further comprising aligning an edge of said opaque material between a row or column of said imager.

39. The method of claim 37 further comprising performing said test on a plurality of second imagers if said test using the first imager is within an acceptable error margin.

40. The method of claim 37, wherein said method occurs during an automated testing process.

41. The method of claim 40, wherein said method occurs during probe testing of an imager array.

42. The method of claim 37, wherein said opaque material is comprised of a metal.

43. The method of claim 37, wherein said collimated and non-collimated photon source has an intensity below photosensitive cell saturation intensity.

44. The method of claim 37, wherein said imager is a CMOS imager.

45. The method of claim 37, wherein said imager is a CCD imager.

46. A computer program stored on a computer readable storage medium for operating a computer to perform a method of testing an imager array, the method comprising:
   exposing the imager to a photon source;
   measuring an output of first and second photosensitive cells, wherein the first cell is blocked from the photon source by a layer of opaque material formed within the imager; and
   calculating the MTF using the measured outputs.

47. The computer program of claim 46, wherein said first and second cells are adjacent.

48. The computer program of claim 47, wherein a plurality of photosensitive cells blocked by said opaque material are measured and a plurality of photosensitive cells not blocked by said opaque material, adjacent to said blocked photosensitive cells are measured.

49. The computer program of claim 48, wherein said measuring includes the averaging of output signals from a first column and averaging the output signal from a second column of adjacent photosensitive cells.

50. A computer program stored on a computer readable storage medium for operating a computer to perform a method of testing an imager array, the method comprising:
   exposing a first and second predetermined number of photosensitive cells in at least one of a row and column of adjacent photosensitive cells of the imager to a photon source, wherein the first predetermined number of photosensitive cells are blocked from the photon source by a layer of opaque material formed within the imager;
   measuring an output of the first and second predetermined number of photosensitive cells; and
   calculating the MTF using the measured outputs.

51. The computer program of claim 50, wherein said measurements taken from said plurality of photosensitive cells blocked by said opaque material are averaged and said plurality of photosensitive cells not blocked by said opaque material, adjacent to said blocked photosensitive cells are averaged.

52. A test system for an imager array containing photosensitive cells, the test system comprising:
   a light source for exposing at least a portion of the imager array to photons;
   a processor coupled to an output of first and second adjacent photosensitive cells of said array, wherein the first cell is blocked from the photon source by a layer of opaque material formed within the imager, said processor determining a modulation transfer function of said imager array from the output signal of said blocked and unblocked photosensitive cells.

53. The system of claim 52, wherein said imager contains an opaque material which defines said blocked and unblocked photosensitive cells.

54. The system of claim 52, wherein a plurality of photosensitive cells blocked by said opaque material are measured and a plurality of photosensitive cells not blocked by said opaque material, adjacent to said blocked photosensitive cells are measured.

55. The system of claim 54, wherein said measurements taken from said plurality of photosensitive cells blocked by said opaque material are averaged and said plurality of photosensitive cells not blocked by said opaque material, adjacent to said blocked photosensitive cells are averaged.

56. The system of claim 52, wherein said light source has an intensity below photosensitive cell saturation intensity.

57. A test system for an imager array containing photosensitive cells, the test system comprising:
   a light source for exposing at least a portion of the imager array to photons;
   a processor coupled to an output of a first and second predetermined number of photosensitive cells in at least one of a row and column of adjacent photosensitive cells of said array, wherein the first predetermined number of photosensitive cells are blocked from the light source by a layer of opaque material formed within the imager, said processor determining a modulation transfer function of said imager array from the output signal of said blocked and unblocked photosensitive cells.

58. The system of claim 57, wherein said imager contains an opaque material which defines said blocked and unblocked photosensitive cells.

59. The system of claim 57, wherein said determining averages said output from said plurality of photosensitive cells blocked by said opaque material and averages said output from said plurality of photosensitive cells not blocked by said opaque material, adjacent to said blocked photosensitive cells are averaged.

60. The system of claim 57, wherein said light source has an intensity below photosensitive cell saturation intensity.

* * * * *